US009285675B2

(12) United States Patent
Hamaya et al.

(10) Patent No.: US 9,285,675 B2
(45) Date of Patent: Mar. 15, 2016

(54) IMPRINT APPARATUS (75) Inventors: Zenichi Hamaya, Utsunomiya (JP);
Noriyasu Hasegawa, Utsunomiya (JP);
Setsuo Yoshida, Saitama (JP); Yoshihiro Shiode, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 488 days.

(21) Appl. No.: 13/603,523

(22) Filed: Sep. 5, 2012

(65) Prior Publication Data

US 2013/0056904 A1 Mar. 7, 2013

(30) Foreign Application Priority Data

Sep. 7, 2011 (JP) .................. 2011-194584

(51) Int. Cl.
*G03F 7/00* (2006.01)
*B82Y 10/00* (2011.01)
*B82Y 40/00* (2011.01)
*B29C 59/02* (2006.01)

(52) U.S. Cl.
CPC ............ *G03F 7/0002* (2013.01); *B29C 59/022* (2013.01); *B82Y 10/00* (2013.01); *B82Y 40/00* (2013.01); *B29C 2059/023* (2013.01)

(58) Field of Classification Search
None
See application file for complete search history.

(56) References Cited

U.S. PATENT DOCUMENTS

| | | | |
|---|---|---|---|
| 6,137,562 A * | 10/2000 | Masuyuki et al. | 355/73 |
| 6,900,881 B2 * | 5/2005 | Sreenivasan et al. | 355/72 |
| 7,691,313 B2 * | 4/2010 | Choi et al. | 264/299 |
| 8,166,876 B2 | 5/2012 | Schneider et al. | |
| 9,090,014 B2 | 7/2015 | Lu et al. | |

FOREIGN PATENT DOCUMENTS

| | | |
|---|---|---|
| EP | 1958025 B1 | 5/2011 |
| JP | 2008540164 A | 11/2008 |
| JP | 2009-518207 A | 5/2009 |
| JP | 2011512019 A | 4/2011 |

OTHER PUBLICATIONS

Japanese Office Action issued in Japanese counterpart application No. JP2011-194584, dated Aug. 4, 2015. English translation provided.

* cited by examiner

*Primary Examiner* — Benjamin Schiffman
(74) *Attorney, Agent, or Firm* — Rossi, Kimms & McDowell LLP (57) ABSTRACT An imprint apparatus includes a deforming unit configured to deform the mold held by the mold holding unit into a convex shape toward the substrate; a driving unit configured to change an attitude of the mold or the substrate during a pressing in which the mold deformed is pressed against the uncured resin to thereby make a position of a contact region at which the mold is brought into contact with the uncured resin movable; a control unit configured to calculate a plane coordinates of a centroid of the contact region based on an image information of the contact region acquired by a measuring unit and to control an operation of the driving unit such that the plane coordinates position of the centroid is directed toward the plane coordinates position of the centroid of a pattern-forming region on the substrate, which has been calculated or has been acquired in advance.

16 Claims, 9 Drawing Sheets

IMPRINT APPARATUS

BACKGROUND OF THE INVENTION

1. Field of the Invention

The present invention relates to an imprint apparatus and an article manufacturing method using the same.

2. Description of the Related Art

As the demand for microfabrication of semiconductor devices or MEMS increases, not only a conventional photolithography technology but also a microfabrication technology in which an uncured resin on a substrate is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a shot region (imprint region) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

Since the internal atmosphere of the imprinting apparatus employing the aforementioned technology is basically gas (ambient air), air bubbles may be entrapped in a resin when a mold is pressed against the resin on a substrate. If the resin is cured with air bubbles entrapped therein, there is a high probability that defects will occur in the pattern to be formed. In order to avoid the occurrence of such pattern defects, Japanese Patent Laid-Open No. 2009-518207 discloses a method for removing gas between a mold and a resin in which the mold is temporarily deflected into a convex shape toward the substrate, a resin on the substrate is pressed against the mold in this state, and the mold is gradually restored to a flat surface so as to press the entire pattern surface against the resin. According to the method, gas present between a mold and a resin may be discharged from the inside to the outside, and thus, air bubbles entrapped in a resin may be reduced.

Here, as with the apparatus disclosed in Japanese Patent Laid-Open No. 2009-518207, if a mold is pressed against a resin on a substrate as the mold is deformed, the contact region between the mold and the resin gradually increases as the pressing operation progresses to eventually extend to a pattern-forming region (the area of the resin). However, the centroid of the contact region may be displaced from the center of the pattern-forming region in the course of the pressing operation depending on the deflection state of the mold or the layout of the pattern formed in the mold. Thus, if the position of the contact region is offset in the XY plane as described above, a portion at which the distance between the boundary of the contact region and the end of the pattern-forming region becomes longer as compared with that at another portion may occur, resulting in a possible increase in a pressing time.

SUMMARY OF THE INVENTION

The present invention provides an imprint apparatus that is advantageous for improvement in throughput.

According to an aspect of the present invention, an imprint apparatus that molds an uncured resin on a substrate using a mold and cures the resin to thereby form a pattern of the cured resin on the substrate is provided that includes a mold holding unit configured to hold the mold; a substrate holding unit configured to hold the substrate; a deforming unit configured to deform the mold held by the mold holding unit into a convex shape toward the substrate; a driving unit configured to change an attitude of the mold or the substrate during a pressing operation in which the mold deformed into the convex shape is pressed against the uncured resin to thereby make a position of a contact region at which the mold is brought into contact with the uncured resin movable; a measuring unit configured to acquire an image information indicating a state of a contact region; and a control unit configured to calculate a plane coordinates of a centroid of the contact region based on the image information and to control an operation of the driving unit such that the plane coordinates position of the centroid is directed toward the plane coordinates position of the centroid of a pattern-forming region on the substrate, which has been calculated based on the image information or has been acquired in advance.

According to the present invention, an imprint apparatus that is advantageous for improvement in throughput may be provided.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

First Embodiment

Figure 1:
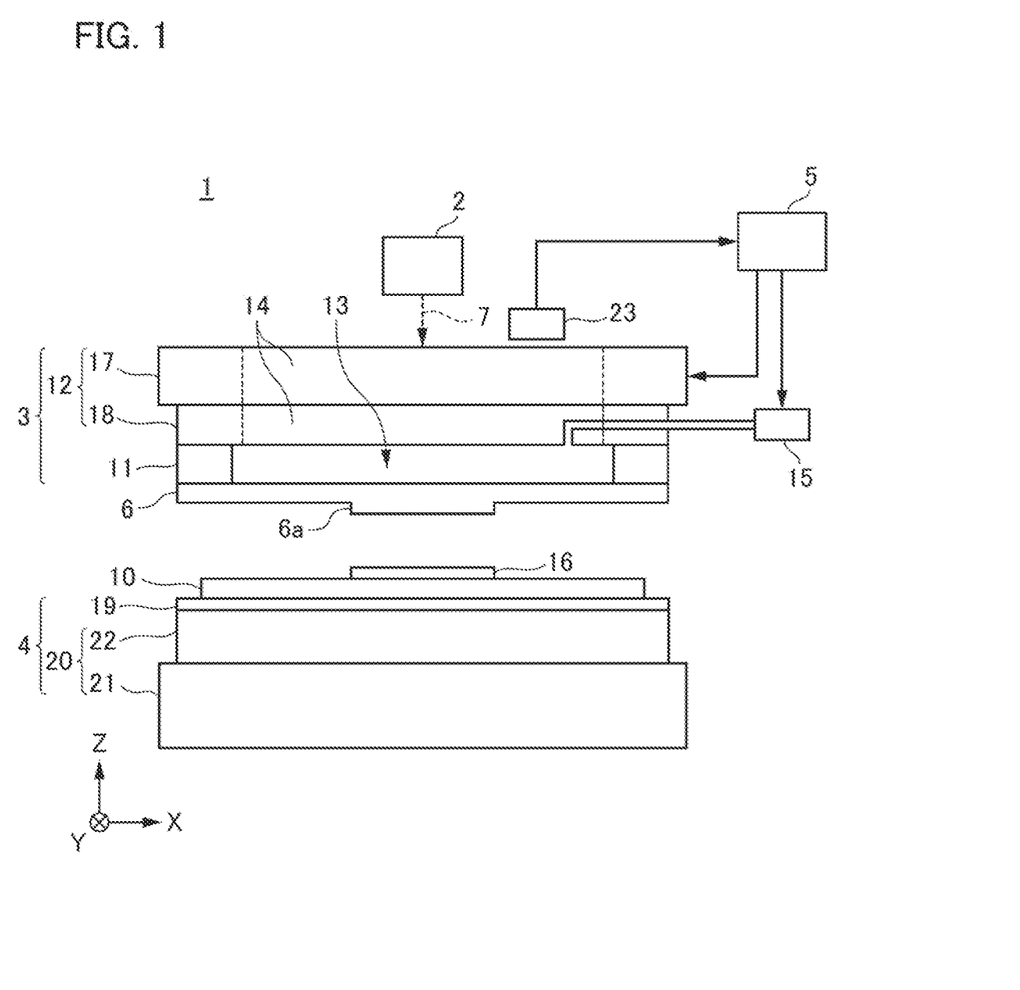
FIG. 1 is a diagram illustrating the configuration of an imprint apparatus according to a first embodiment of the present invention.

Firstly, a description will be given of the configuration of an imprint apparatus according to a first embodiment of the present invention. FIG. 1 is a diagram illustrating the configuration of an imprint apparatus of the present embodiment. The imprint apparatus of the present embodiment is an apparatus that molds an uncured resin on a wafer (on a substrate), i.e., a substrate to be treated, using a mold to thereby form a resin pattern on the wafer, which is used in the manufacture of devices such as semiconductor devices and the like as articles. Note that the imprint apparatus of the present embodiment is an apparatus employing a photo-curing method. In the following drawings, a description will be given where the Z axis is aligned parallel to the optical axis of an irradiation system that irradiates ultraviolet light onto a resin on a wafer, and mutually orthogonal axes X and Y are aligned in directions in a plane perpendicular to the Z axis. Firstly, an imprint apparatus 1 includes a light irradiation unit 2, a mold holding mechanism 3, a wafer stage 4, an application unit, and a control unit 5.

The light irradiation unit 2 irradiates a mold 6 with ultraviolet light 7 during imprint processing. The light irradiation unit 2 is constituted by a light source (not shown) and an optical element that adjusts the ultraviolet light 7 emitted from the light source to light suitable for imprinting. Note that, in the present embodiment, the light irradiation unit 2 is installed for employing a photo-curing method. If a thermosetting method is employed, a heat source unit for curing a thermosetting resin may be installed instead of the light irradiation unit 2.

The outer peripheral shape of the mold 6 is rectangular and the mold 6 includes a pattern section (e.g., the concave and convex pattern of a circuit pattern or the like to be transferred) 6a which is three-dimensionally formed on the surface facing a wafer 10. Also, the material of the mold 6 is a material such as quartz or the like through which the ultraviolet light 7 can pass. Furthermore, for ease of deformation as described below, the mold 6 may be of a shape in which a cavity (concave portion) of a circular planer shape having a certain depth is formed on the surface onto which the ultraviolet light 7 is irradiated.

Firstly, the mold holding mechanism 3 has a mold chuck (mold holding unit) 11 that holds the mold 6 and a mold drive mechanism 12 that holds the mold chuck 11 and moves the mold 6 (the mold chuck 11). The mold chuck 11 may hold the mold 6 by suctioning/attracting the outer peripheral region of the surface of the mold 6 irradiated with the ultraviolet light 7 using a vacuum suction force/an electrostatic force. For example, if the mold chuck 11 holds the mold 6 using a vacuum suction force, the mold chuck 11 is connected to an externally installed vacuum pump (not shown), and attachment/detachment of the mold 6 is switched by turning the vacuum pump ON/OFF. Also, each of the mold chuck 11 and the mold drive mechanism 12 has an aperture region at the central portion (the inside thereof) such that the ultraviolet light 7 emitted from the light irradiation unit 2 is irradiated toward the wafer 10. A light transmission member (e.g. glass plate) 14 is installed within the aperture region such that a space 13 enclosed by a part of the aperture region and the mold 6 is sealed, and the pressure in the space 13 is adjusted by a pressure adjusting device (deforming unit) 15 including a vacuum pump or the like. The pressure adjusting device 15 sets the pressure in the space 13 higher than the external pressure when the mold 6 is pressed against a resin 16 on the wafer 10 so that a pattern section 6a is deflected into a convex shape toward the wafer 10 and the pattern section 6a is brought into contact with the resin 16 from the central portion of the pattern section 6a. With this arrangement, gas (air) is prevented from being entrapped between the pattern section 6a and the resin 16 so that the resin 16 can be filled in the every corner of the convex and concave portion of the pattern section 6a. While, in the present embodiment, the pressure adjusting device 15 serves as a deforming unit configured to deform a mold into a convex shape, the deforming unit is not limited to the pressure adjusting device 15 but may be any unit provided that it can deform a mold into a convex shape.

Furthermore, the mold holding mechanism 3 has a magnification correction mechanism (not shown) that corrects the shape of the mold 6 (the pattern section 6a) by imparting an external force or displacement to the side surface of the mold 6. The magnification correction mechanism is installed at the mold 6-holding side of the mold chuck 11.

The mold drive mechanism 12 moves the mold 6 in each axis direction so as to selectively press the mold 6 against the resin 16 on the wafer 10 or release the mold 6 from the resin 16. The mold drive mechanism 12 is constituted by a coarse movement stage (coarse movement drive system) 17 and a fine movement stage (fine movement drive system) 18. The coarse movement stage 17 is driven in long distance mainly in the Z-axis direction. On the other hand, the fine movement stage 18 follows the coarse movement stage 17 and is finely driven mainly in six-axis (X, Y, Z, $\omega x$, $\omega y$, and $\omega z$) directions. Examples of an actuator employable for the mold drive mechanism 12 include a linear motor, an air cylinder, and the like. The pressing operation and the releasing operation performed by the imprint apparatus 1 may be realized by moving the mold 6 in the Z-axis direction, may be realized by moving the wafer stage 4 in the Z-axis direction, or may also be realized by moving both the mold 6 and the wafer stage 4 relative to each other.

The wafer 10 is, for example, a single crystal silicon substrate or a SOI (Silicon on Insulator) substrate, and an ultraviolet curable resin (hereinafter referred to as "resin") 16, which is molded by the pattern section 6a formed in the mold 6, is applied on the treatment surface of the wafer 10.

The wafer stage (substrate holding unit) 4 holds the wafer 10 and executes position matching between the mold 6 and the resin 16 when the mold 6 is pressed against the resin 16 on the wafer 10. The wafer stage 4 has a wafer chuck 19 that holds the wafer 10 by a suction force and a stage drive mechanism 20 that holds the wafer chuck 19 by a mechanical unit and is movable in each axis direction. The stage drive mechanism 20 is also constituted by a coarse movement stage (coarse movement drive system) 21 and a fine movement stage (fine movement drive system) 22. In this case, the coarse movement stage 21 is driven in long distance mainly in the XY plane. On the other hand, the fine movement stage 22 follows the coarse movement stage 21 and is finely driven mainly in six-axis (X, Y, Z, $\omega x$, $\omega y$, and $\omega z$) directions. Examples of an actuator employable for the stage drive mechanism 20 include a linear motor, a planar motor, and the like.

The application unit (not shown) is installed near the mold holding mechanism 3 and applies the resin (uncured resin) 16 to the wafer 10. Here, the resin 16 is a photocurable resin (imprint material) having the property of being cured by receiving irradiation of the ultraviolet light 7, and is appropriately selected depending on various conditions such as the manufacturing process of semiconductor devices or the like. The amount of the resin 16 to be ejected from the ejection nozzle of the application unit is also appropriately determined by a desired thickness of the resin 16 to be formed on the wafer 10, the density of the pattern to be formed, or the like. Let it be assumed that the "pattern-forming region (shot)" used in the following description has substantially the same area as that of the application region to which the resin 16 is applied for convenience.

The control unit 5 may control the operation, adjustment, and the like of the components of the imprint apparatus 1. The control unit 5 is constituted by a computer or the like and is connected to the components of the imprint apparatus 1 through a line so as to execute control of the components by a program or the like. The control unit 5 of the present embodiment controls at least the operation of the driving unit such as the mold holding unit 3 or the like and the pressure adjusting device 15. Note that the control unit 5 may be integrated with the rest of the imprint apparatus 1 (provided in a shared housing) or may be provided separately from the rest of the imprint apparatus 1 (provided in a separate housing).

Also, the imprint apparatus 1 includes a measuring device (measuring unit) 23 that grasps the state of the contact region when the mold 6 (the pattern section 6a) is brought into contact with the resin 16 on the wafer 10. The measuring device 23 is installed above the mold holding mechanism 3, that is, upstream of the direction in which the ultraviolet light 7 is irradiated. The measuring device 23 is an imaging device such as a CCD camera or the like that acquires the contact region as image information in this case. Furthermore, the imprint apparatus 1 may also include an alignment measurement system, a mold conveyance mechanism that conveys the mold 6 from the exterior of the apparatus to the mold holding mechanism 3, a substrate conveyance mechanism that conveys the wafer 10 from the exterior of the apparatus to the wafer stage 4, and the like, all of which are not shown.

Next, a description will be given of imprint processing performed by the imprint apparatus 1. Firstly, the control unit 5 places and attaches the wafer 10 to the wafer chuck 19 of the wafer stage 4 using the substrate conveyance mechanism, and then moves the wafer stage 4 to the application position of the application unit. Next, as an application step, the application unit applies the resin 16 to a pattern-forming region which is a predetermined area to be processed of the wafer 10. Next, the control unit 5 moves the wafer stage 4 such that the pattern-forming region on the wafer 10 is placed in a position directly below the pattern section 6a formed in the mold 6. Next, the control unit 5 drives the mold drive mechanism 12 so as to press the mold 6 against the resin 16 on the wafer 10 (mold-pressing step). By pressing the mold 6 against the resin 16, the resin 16 is filled in the convex and concave portion of the pattern section 6a. Under this condition, as a curing step, the control unit 5 causes the light irradiation device 2 to emit the ultraviolet light 7 from the top surface of the mold 6, and cures the resin 16 by the ultraviolet light 7 that has been transmitted through the mold 6. Then, after the resin 16 is cured, the control unit 5 drives the mold drive mechanism 12 again to thereby release the mold 6 from the resin 16 (mold-releasing step). By the aforementioned steps, a three dimensionally shaped pattern (layer) of the resin 16 following the convex and concave portion of the pattern section 6a is formed on the surface of the pattern-forming region on the wafer 10. Such a sequence of imprint operations is conducted two or more times while changing the pattern-forming region by driving the wafer stage 4 to thereby be able to form a plurality of patterns of the resin 16 on one wafer 10.

Figure 9A:
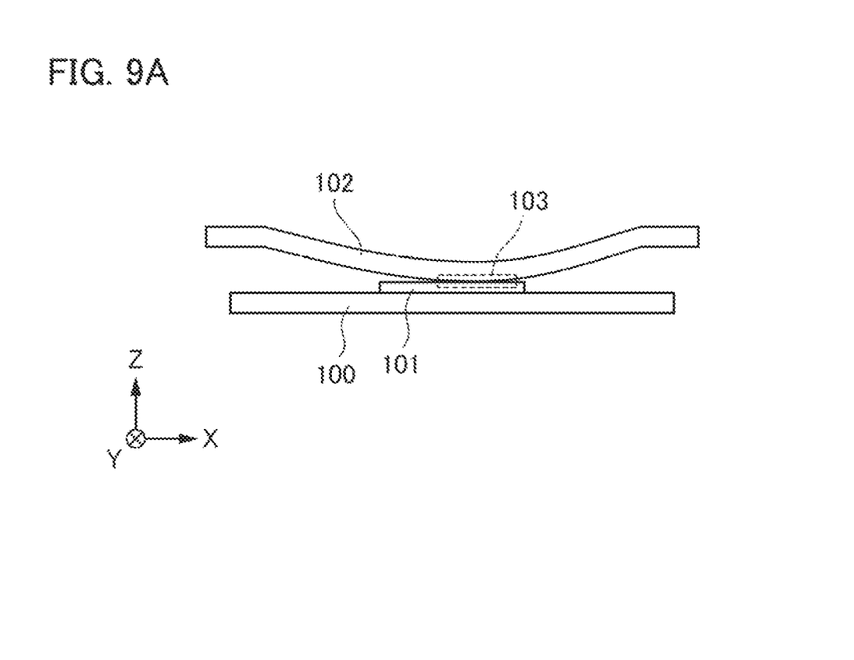
FIGS. 9A and 9B are diagrams illustrating the state of an imprint apparatus in a conventional mold-pressing step.
Figure 9B:
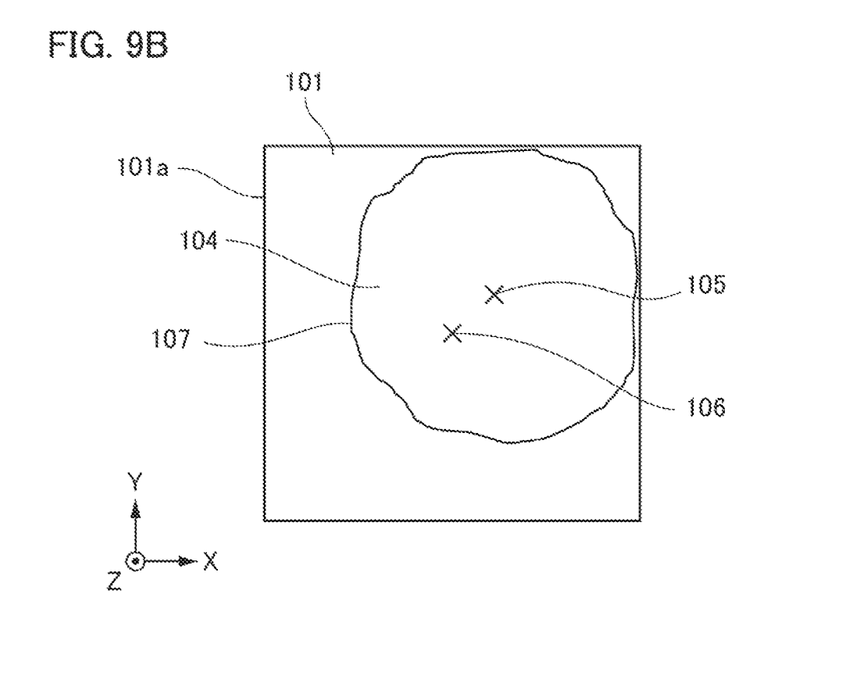

In particular, in the mold-pressing step and the mold-releasing step, the control unit 5 deforms (deflects) the mold 6 into a convex shape toward the wafer 10 by the pressure adjusting device 15 as described above. Here, for comparison, a description will be given of a pressing operation performed by a conventional imprint apparatus. FIGS. 9A and 9B are schematic diagrams illustrating the state of the conventional imprint apparatus during pressing operation. FIG. 9A is a diagram illustrating the state of a mold 102 (a pattern section 103) being pressed against a resin layer 101, which is a pattern-forming region formed on the wafer 100, during the pressing operation. In general, if the mold 6 is pressed against the resin layer 101 on the wafer 100 as the mold 6 is deformed, the contact region between the pattern section 103 and the resin layer 101 gradually increases as the pressing operation progresses to eventually extend to the area of the application region to which the resin layer 101 is applied. However, in the conventional imprint apparatus, the centroid of the contact region may be displaced from the center of the resin layer 101 in the course of the pressing operation depending on the deflection state of the mold 102 or the layout of the pattern formed in the mold 102. FIG. 9B is a plan view illustrating the state of the contact region in such a case. For example, if the position of a contact region 104 is offset in the XY plane, that is, if the centroid 105 of the contact region 104 is displaced from the center 106 of the resin layer 101, the distance between the boundary 107 of the contact region 104 and the end 101a of the resin layer 101 may vary from place to place. Thus, a portion at which the distance between the boundary 107 of the contact region 104 and the end of the resin layer 101 becomes longer as compared with that at another portion may occur, resulting in a possible increase in a pressing time. Accordingly, the imprint apparatus 1 of the present embodiment adjusts the position of the centroid of the contact region as appropriate during the pressing operation such that the position of the contact region is not offset in the XY plane.

Figure 2A:
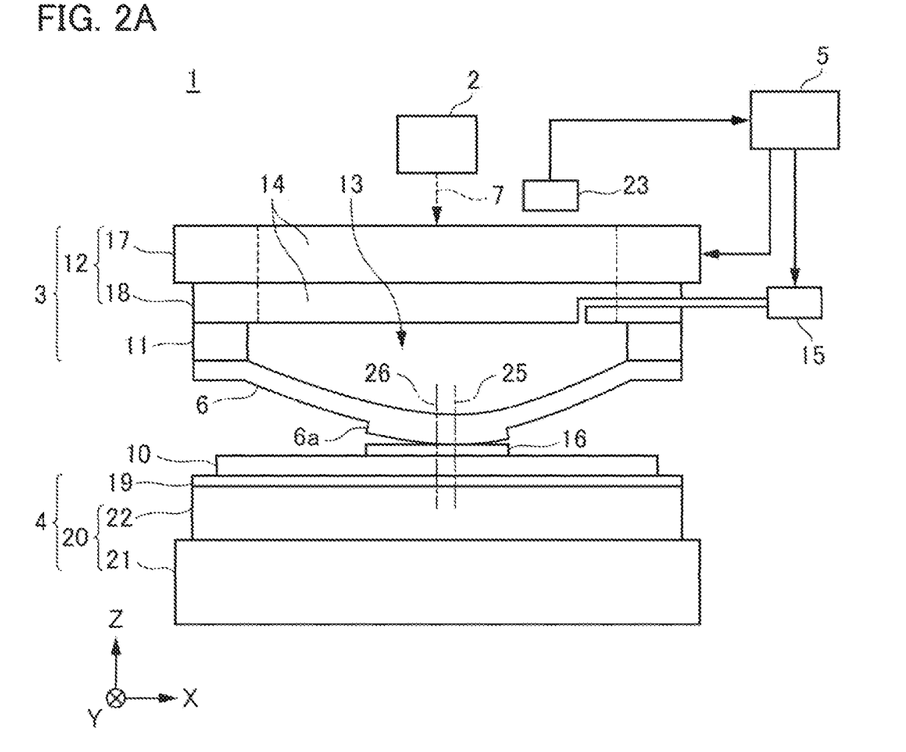
FIGS. 2A and 2B are diagrams illustrating the state of the imprint apparatus according to the first embodiment prior to the centroid adjustment.
Figure 2B:
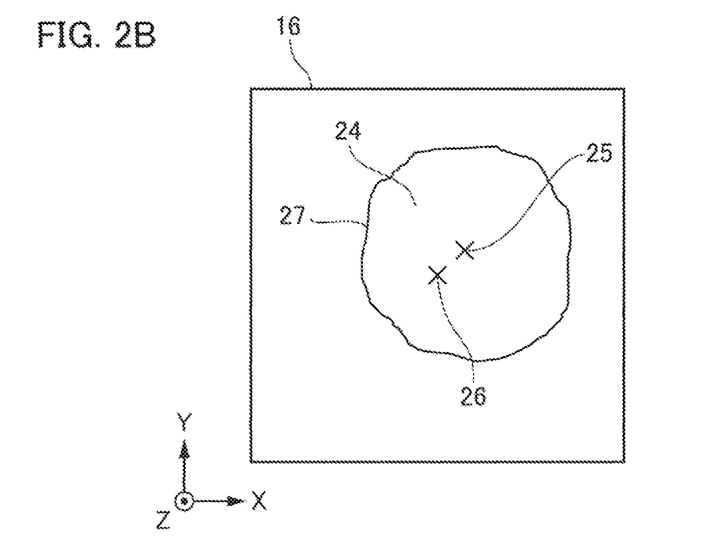
Figure 3:
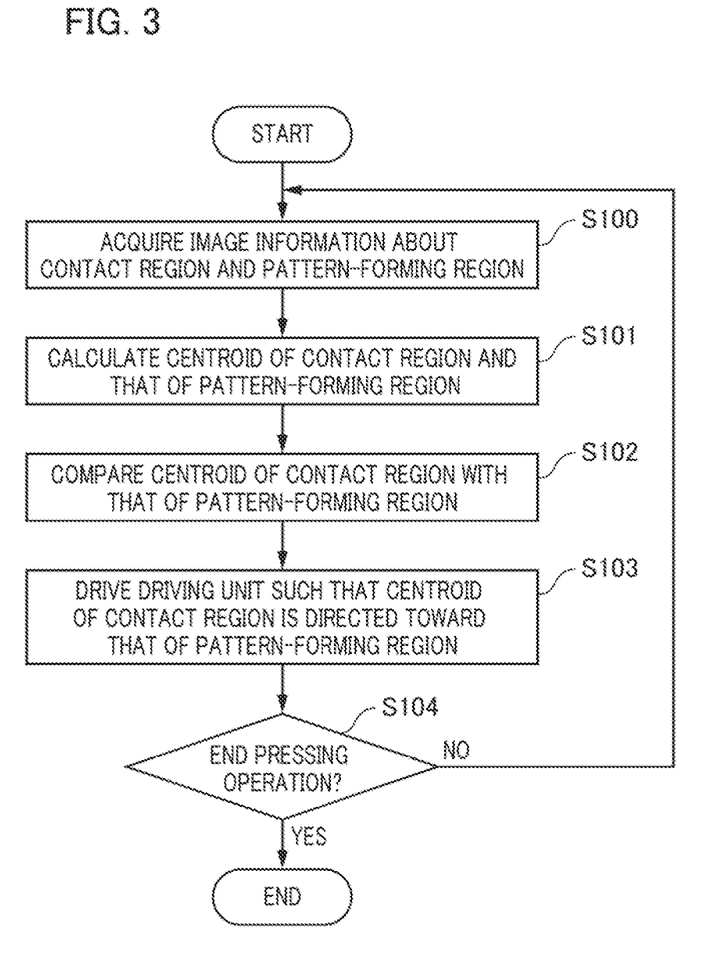
FIG. 3 is a flowchart illustrating the sequence of operations in a mold-pressing step.

FIGS. 2A and 2B are schematic diagrams illustrating the state of the contact region prior to the centroid adjustment in the mold-pressing step. In particular, FIG. 2A is a cross-sectional view illustrating the state of the imprint apparatus 1 corresponding to that shown in FIG. 1, where the mold 6 is in a deformed state, and FIG. 2B is a plan view illustrating the state of a contact region 24 between the pattern section 6a and the resin (resin layer) 16 at this time. Also, FIG. 3 is a flowchart illustrating the sequence of operations performed by the imprint apparatus 1 in the mold-pressing step. Firstly, in the mold-pressing step, the control unit 5 acquires image information about the contact region 24 using a measuring device 23 while the pattern section 6a is being pressed against the resin 16 (step S100). Next, the control unit 5 calculates the position (plane coordinates) of a centroid 25 of the contact region 24 based on the acquired image information (step S101). The position of the centroid 25 can be calculated by replacing the acquired area of the contact region 24 with, for example, a polygon, a circle, an ellipse, or the like as appropriate. Furthermore, concurrently with the calculation of the centroid 25, the control unit 5 calculates the area of the application region of the resin 16 applied on the wafer 10, that is, the position (plane coordinates) of a centroid 26 of the pattern-forming region based on the acquired image information. Note that the centroid 26 may also be calculated in advance prior to the pressing operation. Here, if the entire pattern-forming region is present on the wafer 10 as in the present embodiment, the centroid 26 becomes the center of the area of the application region to which the resin 16 is applied. Next, the control unit 5 compares the position of the calculated centroid 25 with that of the calculated centroid 26 (step S102). Next, the control unit 5 drives the fine movement stage 18 of the mold drive mechanism 12 such that the position of the centroid 25 is always directed toward (matched to) the position of the centroid 26 during the pressing operation (step S103). At this time, the control unit 5 changes the angles ωx and ωy around the XY axis of the mold holding surface in the fine movement stage 18 while moving the coarse movement stage 17 of the mold drive mechanism 12 upward in the Z-axis direction. Subsequently, the control unit 5 repeats the sequence of operations at a certain frequency (NO in step S104). If the control unit 5 determines that the pressing operation has been completed (YES in step S104), the sequence of operations is ended (step S104).

Figure 4A:
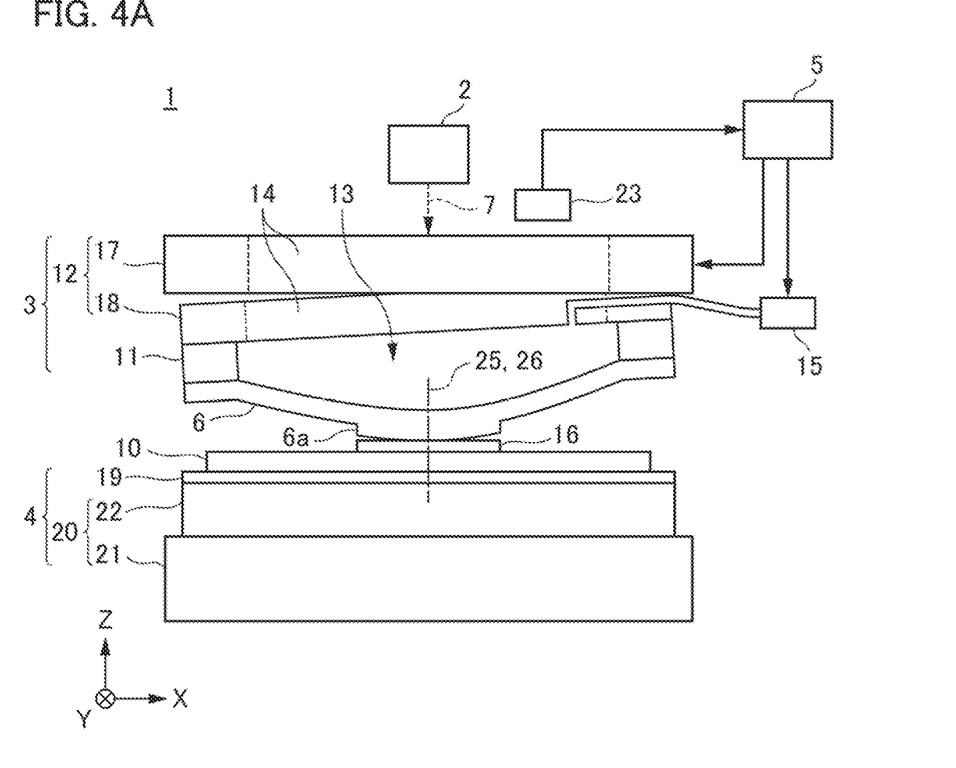
FIGS. 4A and 4B are diagrams illustrating the state of the imprint apparatus according to the first embodiment during the centroid adjustment.
Figure 4B:
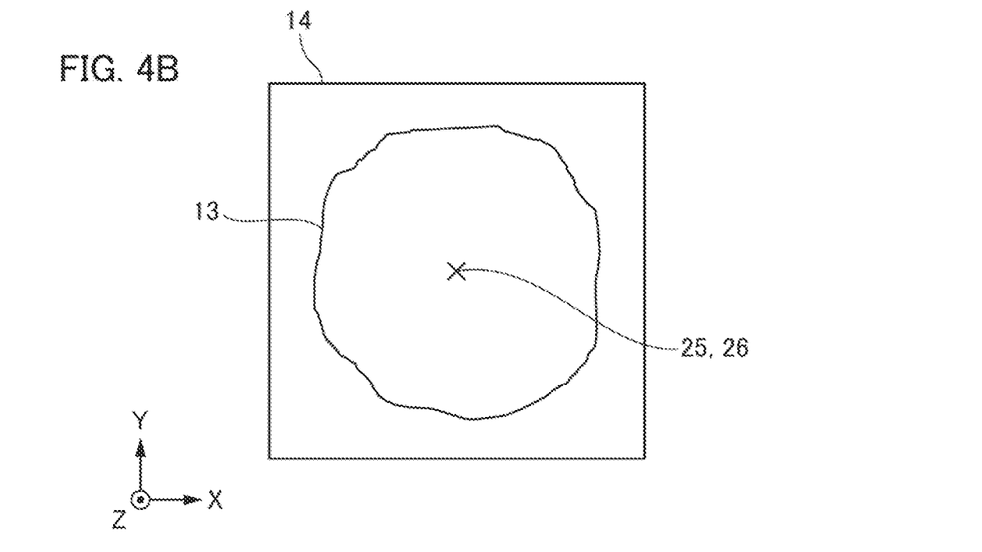

FIGS. 4A and 4B are schematic diagrams illustrating the state of the contact region during the centroid adjustment in a mold-pressing step. In particular, FIG. 4A is a cross-sectional view illustrating the state of the imprint apparatus 1 corresponding to that shown in FIG. 2A, where the fine movement stage 18 is in a drive state, and FIG. 4B is a plan view illustrating the state of the contact region 24 between the pattern section 6a and the resin (resin layer) 16 at this time. For example, as shown in FIG. 4A, the control unit 5 changes the angle ωy around the Y axis of the mold holding surface with respect to the fine movement stage 18 to thereby change the attitude of the mold 6 (the pattern section 6a) held by the fine movement stage 18 via the mold chuck 11. Here, the amount of change in each of the angles ωx and ωy is adjusted based on the offset amount between the centroid 25 and the centroid 26 in the XY plane. The control unit 5 adjusts the angles based on the calculated offset amount, and thus, the position of the centroid 25 is moved as shown in FIG. 4B so as to be matched with the position of the centroid 26. Also, the control unit 5 sets the calculation timing of the centroid 25 in advance such that the accuracy in controlling the position of the centroid 26 is ensured and the amount of change in the angle of the mold holding surface of the fine movement stage 18 is prevented from being excessively large. For example, if a pattern-forming region has the size of 20 mm×30 mm, a distance between adjacent droplets of the resin 16 applied to the wafer 10 is 150 µm, and a time required for pressing is 0.5 sec, it is preferable that the control unit 5 executes the calculation of the centroid 25 at intervals of 0.5 msec. The control unit 5 calculates the centroid 25 at such timing and feedback-controls the amount of change in the angle of the mold holding surface of the fine movement stage 18 so as to maintain the accuracy in controlling the position of the centroid 25.

As described above, the fine movement stage 18 is driven such that the position of the centroid 25 is always directed toward the position of the centroid 26 during the pressing operation, and thus, the contact region 24 may be prevented from being offset in the XY plane. Therefore, the contact region 24 is uniformly expanded from the centroid 26, and thus, an increase in a pressing time is suppressed, resulting in an improvement in entire throughput of the imprint apparatus 1. Also, since the mold 6 is uniformly deflected from the centroid 26 in a mold-pressing step, the occurrence of a local distortion of the mold 6 in the XY axis direction is suppressed, resulting in an improvement in overlay accuracy.

As described above, according to the present embodiment, an imprint apparatus that is advantageous for improvement in throughput may be provided.

Although, in the present embodiment, the fine movement stage 18 on the mold 6 side is employed as a driving unit that drives the position of the centroid 25 of the contact region 24 so as to be directed toward the position of the centroid 26 of the application region to which the resin 16 is applied, the fine movement stage 22 on the wafer 10 side may also be employed. In this case, the coarse movement stage 21 and the fine movement stage 22 of the stage drive mechanism 20 operate in accordance with the coarse movement stage 17 and the fine movement stage 18 of the mold drive mechanism 12, respectively, in the aforementioned description.

Second Embodiment

Figure 5A:
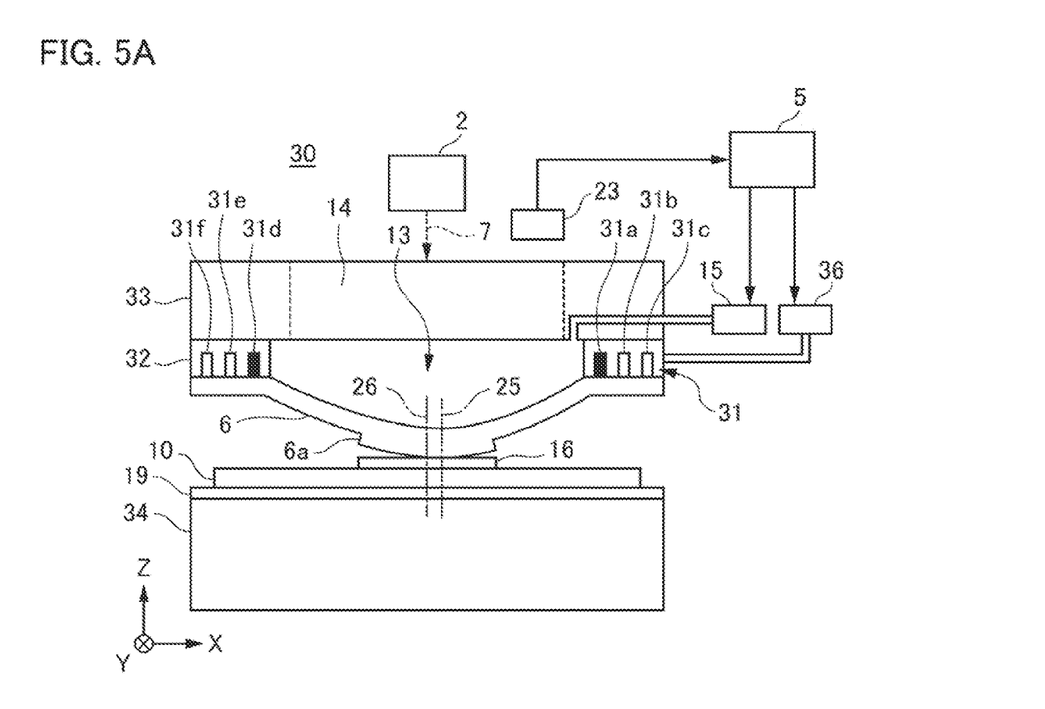
FIGS. 5A and 5B are diagrams illustrating the state of an imprint apparatus according to a second embodiment prior to the centroid adjustment.
Figure 5B:
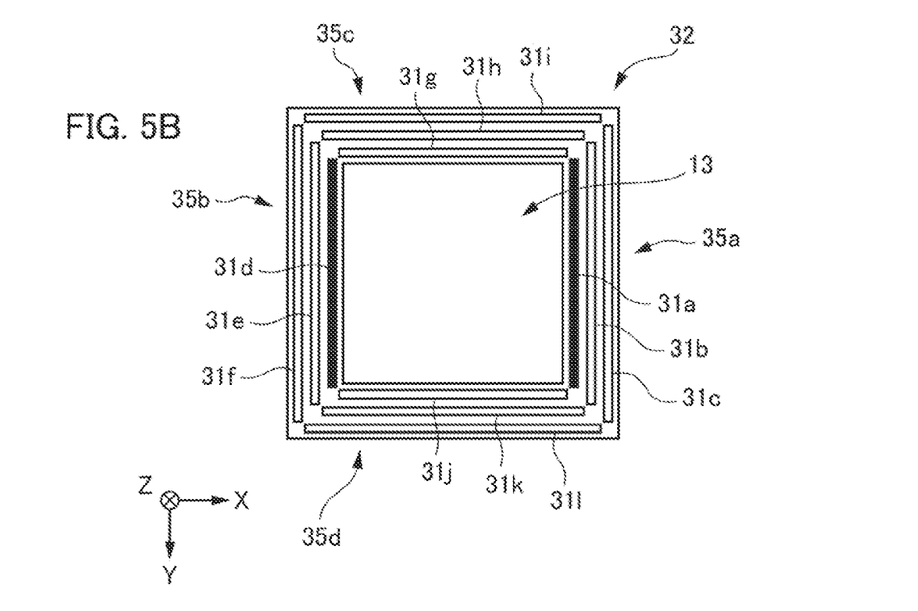

Next, a description will be given of an imprint apparatus according to a second embodiment of the present invention. FIGS. 5A and 5B are schematic diagrams illustrating the state of an imprint apparatus 30 according to the present embodiment prior to the centroid adjustment in a mold-pressing step. In particular, FIG. 5A is a cross-sectional view illustrating the configuration of the imprint apparatus 30. In FIG. 5A, the same elements as those in the imprint apparatus 1 of the first embodiment shown in FIG. 1 are designated by the same reference numerals, and explanation thereof will be omitted. A feature of the imprint apparatus 30 lies in the fact that a mold chuck 32 having a plurality of suction grooves 31 provided on the suction surface thereof is employed as a driving unit that drives the position of the centroid 25 of the contact region 24 so as to be directed toward the position of the centroid 26 of the application region to which the resin 16 is applied. In this case, a mold drive mechanism 33 of the present embodiment, which corresponds to the mold drive mechanism 12 of the first embodiment, may be a unitary drive mechanism that is movable at least in the Z-axis direction instead of one having two drive systems which are a coarse movement stage and a fine movement stage. Likewise, a stage drive mechanism 34 of the present embodiment, which corresponds to the stage drive mechanism 20 of the first embodiment, may also be a unitary drive mechanism that is movable at least in the XY axis direction instead of one having two drive systems which are a coarse movement stage and a fine movement stage.

FIG. 5B is a plan view illustrating the configuration of a mold chuck 32 as seen from the mold 6 side and the suction state of the mold chuck 32 in this case. By way of example, the mold chuck 32 has three suction grooves 31 arranged in parallel from the inside toward the outside on each of four regions (a first region 35a to a fourth region 35d) of a suction surface 35 in the XY plane. These suction grooves 31 include a first suction groove 31a, a second suction groove 31b, and a third suction groove 31c, which are arranged at the first region 35a in the X axis direction, and a fourth suction groove 31d, a fifth suction groove 31e, and a sixth suction groove 31f, which are arranged at the second region 35b opposite to the first region 35a. Furthermore, the suction grooves 31 include a seventh suction groove 31g, an eighth suction groove 31h, and a ninth suction groove 31i, which are arranged at the third region 35c in the Y axis direction, and a tenth suction groove 31j, an eleventh suction groove 31k, and a twelfth suction groove 31l, which are arranged at the fourth region 35d opposite to the third region 35c. Each of these suction grooves 31 is connected to a vacuum pump 36 via a switching mechanism. When the mold 6 is held by suction, the control unit 5 controls the switching ON/OFF of the suction of each of these suction grooves 31 independently of one another. Here, in the example shown in FIG. 5B, the control unit 5 sets the suction of two suction grooves 31, which are the first suction groove 31a in the X axis direction and the fourth suction groove 31d opposite to the first suction groove 31a, to "ON". In FIG. 5B, the suction grooves 31 in which the suction is switched "ON" are denoted in black for ease of explanation.

Figure 6A:
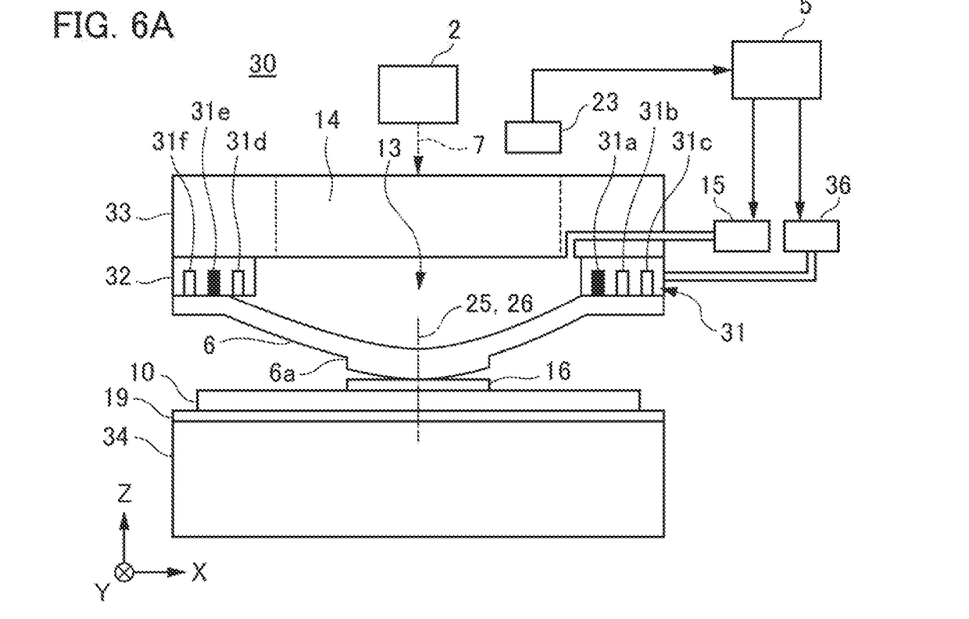
FIGS. 6A and 6B are diagrams illustrating the state of the imprint apparatus according to the second embodiment during the centroid adjustment.
Figure 6B:
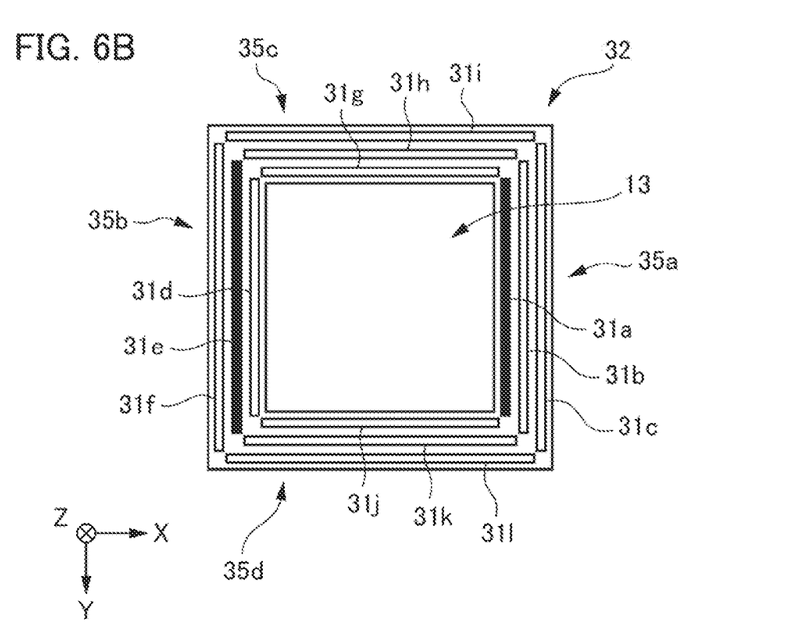

In contrast, FIGS. 6A and 6B are schematic diagrams illustrating the state of the imprint apparatus 30 according to the present embodiment during the centroid adjustment in a mold-pressing step. In particular, FIG. 6A corresponds to FIG. 5A and FIG. 6B corresponds to FIG. 5B. In the first embodiment, the control unit 5 controls the position of the centroid 25 so as to be always directed toward the position of the centroid 26 by driving the fine movement stage 18 of the mold drive mechanism 12 in step S103 in the sequence of operations shown in FIG. 3. In contrast, in the present embodiment, the control unit 5 controls the position of the centroid 25 so as to be always directed toward the position of the centroid 26 by switching a portion in which the suction is switched "ON" from among the plurality of suction grooves 31 provided in the mold chuck 32. For example, in the example shown in FIG. 6B, the control unit 5 changes the suction state shown in FIG. 5B to the suction state in which the suction of the first suction groove 31a remains "ON" but the suction of the fourth suction groove 31d is switched "OFF" and the suction of the fifth suction groove 31e positioned outwardly adjacent to the fourth suction groove 31d is switched "ON". At this time, selection of the suction grooves 31 is adjusted based on the offset amount between the centroid 25 of the contact region 24 and the centroid 26 in the XY plane. As described above, the suction operation of a plurality of suction grooves 31 is switched independently of one another. Consequently, the attitude of the pattern section 6a is changed with change in the deflected shape of the mold 6 so that the position of the centroid 25 of the contact region 24 can be moved during the pressing operation. With this arrangement, according to the present embodiment, the same effects as those of the first embodiment can be obtained.

Third Embodiment

Figure 7A:
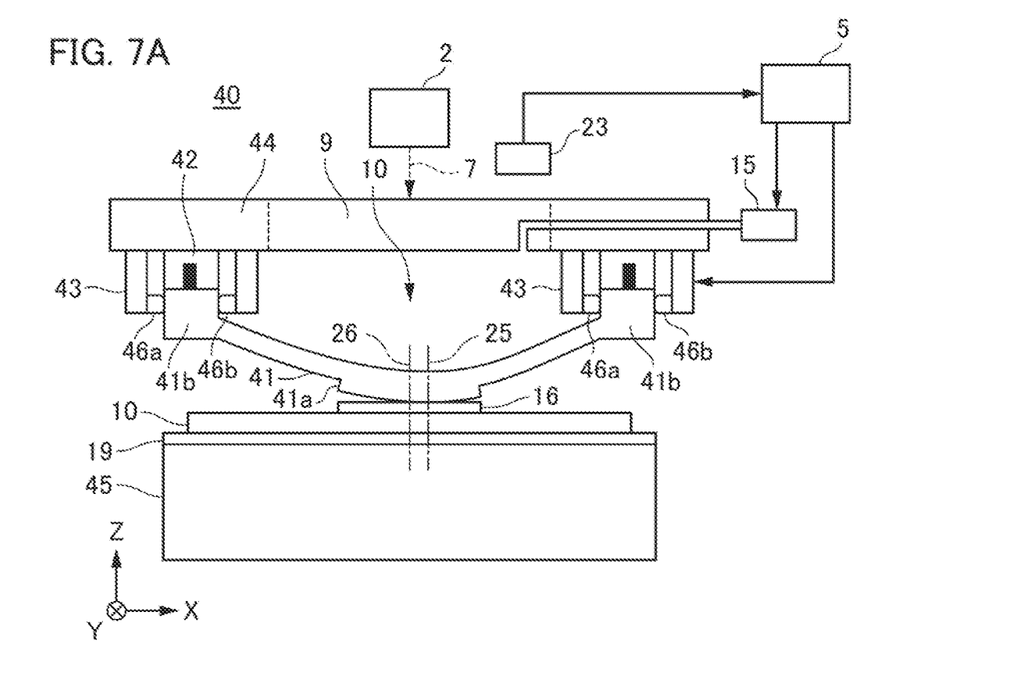
FIGS. 7A and 7B are diagrams illustrating the state of an imprint apparatus according to a third embodiment.
Figure 7B:
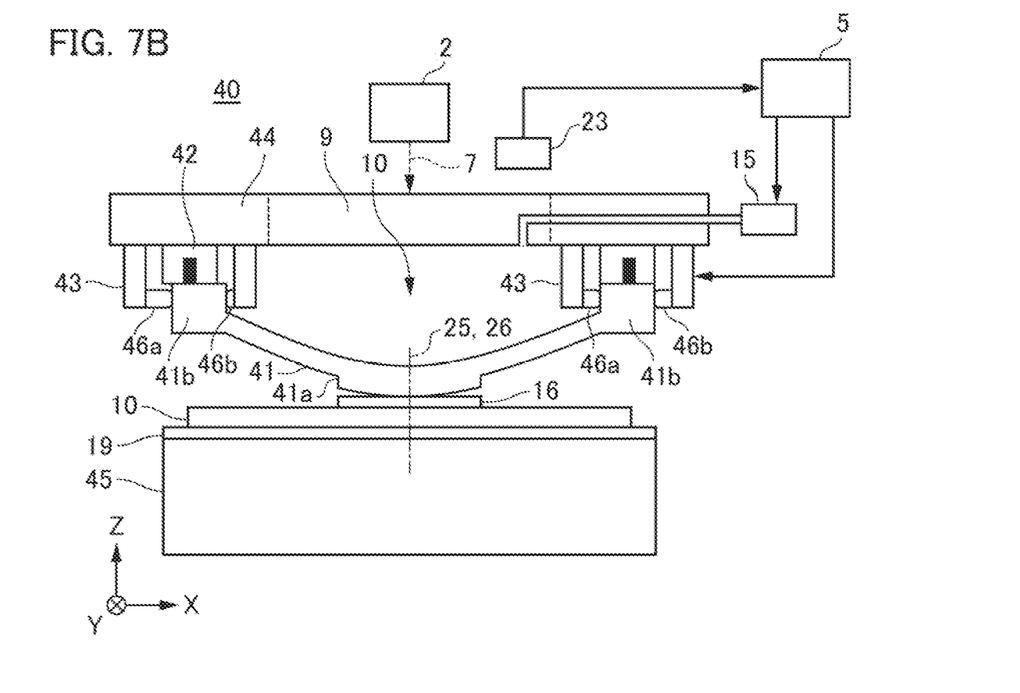

Next, a description will be given of an imprint apparatus according to a third embodiment of the present invention. FIGS. 7A and 7B are schematic diagrams illustrating the state of an imprint apparatus 40 according to the present embodiment prior to the centroid adjustment and during the centroid adjustment in a mold-pressing step. In particular, FIG. 7A is a cross-sectional view illustrating the state of the imprint apparatus 40 prior to the centroid adjustment. In FIG. 7A, the same elements as those in the imprint apparatus 1 of the first embodiment shown in FIG. 1 are designated by the same reference numerals, and explanation thereof will be omitted. A feature of the imprint apparatus 40 lies in the fact that a moving mechanism 43 that moves a mold 41 in the XY axis direction while holding the mold 41 by suction using a mold chuck 42 is employed as a driving unit that drives the position of the centroid 25 of the contact region 24 so as to be directed toward the position of the centroid 26 of the application region to which the resin 16 is applied. Also in this case, a mold drive mechanism 44 of the present embodiment, which corresponds to the mold drive mechanism 12 of the first embodiment, may be a unitary drive mechanism that is movable at least in the Z-axis direction instead of one having two drive systems which are a coarse movement stage and a fine movement stage. Likewise, a stage drive mechanism 45 of the present embodiment, which corresponds to the stage drive mechanism 20 of the first embodiment, may also be a unitary drive mechanism that is movable at least in the XY axis direction instead of one having two drive systems which are a coarse movement stage and a fine movement stage.

Firstly, the outer shape of the mold 41 of the present embodiment and the shape of a pattern section 41a thereof are the same as compared with those of the mold 6 of the aforementioned embodiment, but the outer periphery of the mold 41 of the present embodiment, which includes a suction surface with respect to the mold chuck 42, has a different shape. In other words, the central portion of the mold 41 is thin so as to be readily deformed into a convex shape toward the wafer 10, and the outer periphery is formed by a thick wall portion 41b. Consequently, the mold 41 may be of a shape in which a cavity (concave portion) of a circular planer shape having a certain depth is formed on the central portion of the surface onto which the ultraviolet light 7 is irradiated. In contrast, the moving mechanism 43 is installed in, for example, the mold drive mechanism 44 and moves the mold 41 to the XY axis direction by imparting an external pressure independently to four wall surfaces of the wall portion 41b. As shown in FIG. 7A, the moving mechanism 43 may include a pair of abutting rods 46 (46a and 46b) that are in contact with the inside and outside of the wall portion 41b such that the abutting rods 46 are driven by an actuator installed within the moving mechanism 43 in the XY axis direction.

On the other hand, FIG. 7B is a cross-sectional diagram illustrating the state of the imprint apparatus 40 during the centroid adjustment. In the present embodiment, the control unit 5 controls the position of the centroid 25 so as to be always directed toward the position of the centroid 26 by appropriately adjusting the amount of the four abutting rods 46 to be pushed out by the moving mechanism 43. For example, in the example shown in FIG. 7B, the control unit 5 changes the state of the abutting rods 46 shown in FIG. 7A to the state in which one of the abutting rods 46 remains unchanged in the same state but the other of the abutting rods 46 is pushed out so as to make the wall portion 41b face inward. At this time, the amount that the abutting rod 46 is pushed out is adjusted based on the offset amount between the centroid 25 of the contact region 24 and the centroid 26 in the XY plane. As described above, the deflected shape of the mold 41 is changed by applying an external pressure to the mold 41 using the moving mechanism 43. Consequently, the attitude of the pattern section 41a is changed so that the position of the centroid 25 of the contact region 24 can be moved during the pressing operation. With this arrangement, according to the present embodiment, the same effects as those of the first embodiment can be obtained.

If the mold 41 remains displaced from the mold chuck 42 in the XY axis direction after completion of the pressing operation, the control unit 5 restores the state of the mold 41 back to its original state by moving the mold 41 again using the moving mechanism 43. Then, if the relative position between the mold 41 and the wafer 10 in the XY axis direction has been measured prior to the pressing operation, the control unit 5 moves the mold 41 (executes position matching) using the moving mechanism 43 based on the measurement result. On the other hand, if the relative position between the mold 41 and the wafer 10 in the XY axis direction is measured after completion of the pressing operation, the control unit 5 moves the mold 41 using the moving mechanism 43 based on the measurement result at this point. As described above, the displacement of the mold 41 in the XY axis direction is corrected in advance prior to a curing step, and thus, the displacement of the pattern-forming position from a desired position with respect to the wafer 10 can be suppressed.

Fourth Embodiment

Figure 8A:
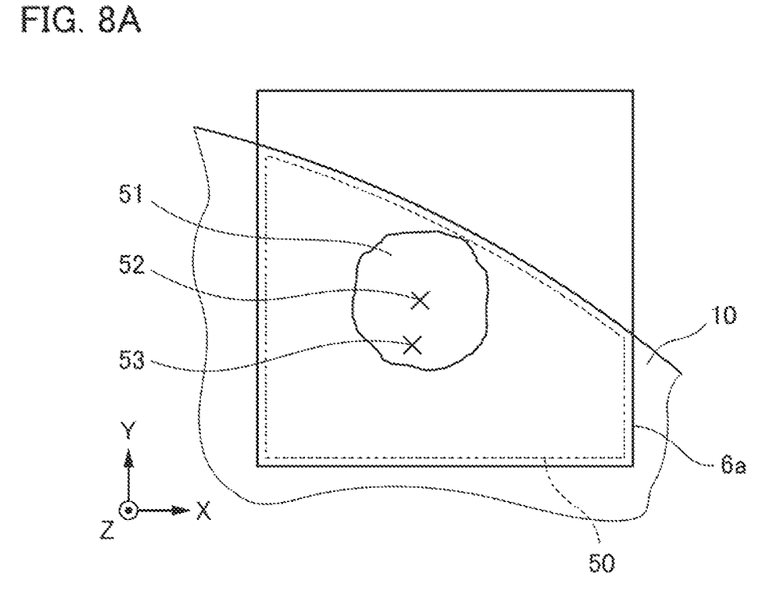
FIGS. 8A and 8B are diagrams illustrating the state of the contact region at the end of a wafer according to a fourth embodiment.
Figure 8B:
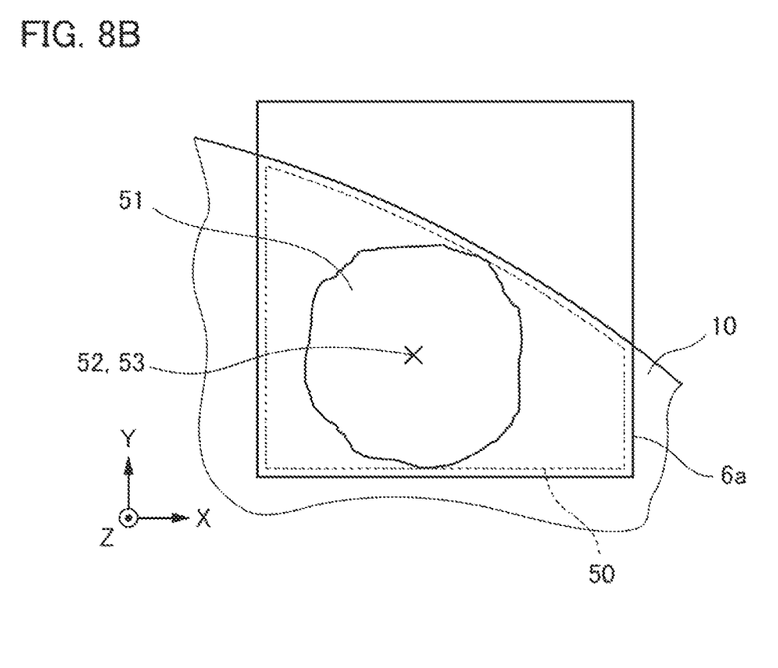

Next, a description will be given of an imprint apparatus according to a fourth embodiment of the present invention. While the embodiment has been described with reference to a case in which the pattern-forming region, which is an area to be processed, is present on the entire wafer 10, the present embodiment will be described with reference to a case where the pattern-forming region is present at the end of the wafer 10. Here, the expression "a case where the pattern-forming region is present at the end of the wafer 10" as used herein refers to a case where the pressing position in this case occupies a part of the end of the wafer 10. FIGS. 8A and 8B are plan views illustrating the state of a contact region 51 when the pressing operation is performed on a pattern-forming region 50 which is present at the end of the wafer 10. In particular, FIG. 8A is a diagram illustrating the state of the contact region 51 prior to the centroid adjustment and FIG. 8B is a diagram illustrating the state of the contact region 51 prior to the centroid adjustment. Firstly, when the pressing operation is started at the end of the wafer 10, the contact region 51 is present near the center of the pattern section 6a on the initial stage but gradually moves and increases according to the shape of a pattern-forming region (resin application region) 50 as the pressing operation proceeds. On the final stage, the contact region 51 extends across the whole area of the pattern-forming region 50. The shape of the pattern-forming region 50 is not limited to the example shown in FIG. 8A but differs depending on the location of the end of the wafer 10. Thus, as in step S101 shown in FIG. 3 of the first embodiment, the control unit 5 firstly calculates the position of a centroid 52 of the contact region 51 based on the image information acquired by the measuring device 23 during the pressing operation. Furthermore, in the present embodiment, the control unit 5 also calculates the position of a centroid 53 of the pattern-forming region 50, which is present at the end of the wafer 10, based on the image information acquired by the measuring device 23. Then, as in step S102 and the subsequent steps shown in FIG. 3, the control unit 5 compares the calculated position of the centroid 52 with that of the centroid 53 and executes the centroid adjustment such that the position of the centroid 52 is always directed toward the position of the centroid 53 as shown in FIG. 8B. According to the present embodiment, even if the pattern-forming region is present at the end of the wafer 10, the contact region 51 is uniformly expanded from the centroid 53 of the pattern-forming region 50, and thus, an increase in a pressing time is suppressed, resulting in an improvement in throughput of the entire imprint apparatus 1.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like is manufactured, the manufacturing method may include another step, such as processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-194584 filed Sep. 7, 2011 which is hereby incorporated by reference herein in its entirety.

What is claimed is:

1. An imprint apparatus that molds an uncured resin on a substrate using a mold and cures the resin to thereby form a pattern of the cured resin on the substrate, the imprint apparatus comprising:
a mold holding unit configured to hold the mold;
a substrate holding unit configured to hold the substrate;
a deforming unit configured to deform the mold held by the mold holding unit into a convex shape toward the substrate;
a driving unit configured to change an attitude of the mold or the substrate during a pressing operation in which the mold deformed into the convex shape is pressed against the uncured resin to thereby make a position of a contact region at which the mold is brought into contact with the uncured resin movable;
a measuring unit configured to acquire an image information indicating a state of the contact region; and
a control unit configured to calculate a plane coordinates of a centroid of the contact region based on the image information and to control an operation of the driving unit such that the plane coordinates position of the centroid is directed toward the plane coordinates position of the centroid of a pattern-forming region on the substrate, which has been calculated based on the image information or has been acquired in advance.

2. The imprint apparatus according to claim 1, wherein the deforming unit deforms the mold into the convex shape toward the substrate by adjusting pressure in a space in contact with the mold.

3. The imprint apparatus according to claim 1, wherein, when a pressing position in which the mold is pressed against the uncured resin is caught at an end of the substrate, the control unit executes calculation of the plane coordinates of the centroid of the pattern-forming region in parallel with calculation of the plane coordinates of the centroid of the contact region.

4. The imprint apparatus according to claim 3, wherein the driving unit is a drive system that is installed in the mold holding unit and changes an angle of a holding surface of the mold in the mold holding unit with respect to a plane of the substrate.

5. The imprint apparatus according to claim 3, wherein the driving unit is a drive system that is installed in the substrate holding unit and changes an angle of a holding surface of a substrate in the substrate holding unit with respect to the surface of the mold.

6. The imprint apparatus according to claim 3, wherein the driving unit is the mold holding unit that comprises a plurality of suction grooves that holds the mold by suction and a switching mechanism that is capable of switching the suction of each of the plurality of suction grooves independently of one another.

7. The imprint apparatus according to claim 3, wherein the driving unit is a moving mechanism that moves the mold deformed into the convex shape toward the substrate while being held by the mold holding unit parallel to a plane of the substrate.

8. The imprint apparatus according to claim 7, wherein the control unit restores a state of the mold and the substrate moved in parallel back to its original state by the moving mechanism after completion of the pressing operation.

9. The imprint apparatus according to claim 8, wherein the control unit executes position matching based on a measurement result of a relative position between the mold and the substrate prior to the pressing operation.

10. The imprint apparatus according to claim 8, wherein the control unit executes position matching based on a measurement result of a relative position between the mold and the substrate after completion of the pressing operation.

11. The imprint apparatus according to claim 1, wherein the driving unit is a drive system that is installed in the mold holding unit and changes an angle of a holding surface of the mold in the mold holding unit with respect to a plane of the substrate.

12. The imprint apparatus according to claim 1, wherein the driving unit is a drive system that is installed in the substrate holding unit and changes an angle of a holding surface of the substrate in the substrate holding unit with respect to a surface of the mold.

13. The imprint apparatus according to claim 1, wherein the driving unit is the mold holding unit that comprises a plurality of suction grooves that holds the mold by suction and a switching mechanism that is capable of switching the suction of each of the plurality of suction grooves independently of one another.

14. The imprint apparatus according to claim 1, wherein the driving unit is a moving mechanism that moves the mold deformed into the convex shape toward the substrate while being held by the mold holding unit parallel to a plane of the substrate.

15. An article manufacturing method comprising:
   forming, in a pattern-forming step, a resin pattern on a substrate using the imprint apparatus according to claim 1; and
   processing the substrate on which the pattern has been formed in the pattern-forming step.

16. An imprint apparatus that molds an uncured resin on a substrate using a mold and cures the resin to thereby form a pattern of the cured resin on the substrate, the imprint apparatus comprising:

a mold holding unit configured to hold the mold;
   a substrate holding unit configured to hold the substrate;
   a deforming unit configured to deform the mold held by the mold holding unit into a convex shape toward the substrate;
   a driving unit configured to change an attitude of the mold or the substrate to thereby move a position of a contact region at which the mold is brought into contact with the uncured resin;
   a measuring unit configured to acquire an image information indicating a state of the contact region; and
   a control unit configured to cause the measuring unit to acquire the image information with the mold deformed into the convex shape in contact with the uncured resin and control the driving unit based on an acquired result such that a position of a centroid of the contact region is directed toward a position of a centroid of a pattern surface.

* * * * *